United States Patent
Tewalt

(10) Patent No.: US 11,320,999 B2
(45) Date of Patent: *May 3, 2022

(54) SYSTEM AND METHOD FOR RETAINING DRAM DATA WHEN REPROGRAMMING RECONFIGUREABLE DEVICES WITH DRAM MEMORY CONTROLLERS INCORPORATING A DATA MAINTENANCE BLOCK

(71) Applicant: FG SRC, LLC, Dallas, TX (US)

(72) Inventor: Timothy J. Tewalt, Larkspur, CO (US)

(73) Assignee: FG SRC, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,987

(22) Filed: Jun. 24, 2019

(65) Prior Publication Data
US 2019/0310785 A1 Oct. 10, 2019

Related U.S. Application Data

(60) Division of application No. 15/672,263, filed on Aug. 8, 2017, now abandoned, which is a continuation of
(Continued)

(51) Int. Cl.
*G05F 3/00* (2006.01)
*G06F 3/06* (2006.01)
(Continued)

(52) U.S. Cl.
CPC .......... *G06F 3/0632* (2013.01); *G06F 3/0604* (2013.01); *G06F 3/0659* (2013.01);
(Continued)

(58) Field of Classification Search
CPC .... G06F 3/0632; G06F 3/0604; G06F 3/0659; G06F 3/0688; G06F 12/1027;
(Continued)

(56) References Cited

U.S. PATENT DOCUMENTS 6,119,200 A   9/2000 George
7,774,542 B2 * 8/2010 Zhang ............... G06F 3/061
                                               711/114
(Continued)

OTHER PUBLICATIONS

Motomura et al., An Embedded DRAM-FPGA Chip with Instantaneous Logic Reconfiguration, p. 264 (Year: 1998).*
(Continued)

*Primary Examiner* — Craig S Goldschmidt
(74) *Attorney, Agent, or Firm* — Todd R. Fronek; Larkin Hoffman Daly & Lindgren, Ltd.

(57) ABSTRACT

A system and method for retaining dynamic random access memory (DRAM) data when reprogramming reconfigurable devices with DRAM memory controllers such as field programmable gate arrays (FPGAs). The DRAM memory controller is utilized in concert with a data maintenance block collocated with the DRAM memory and coupled to an I2C interface of the reconfigurable device, wherein the FPGA drives the majority of the DRAM input/output (I/O) and the data maintenance block drives the self-refresh command inputs. Even though the FPGA reconfigures and the majority of the DRAM inputs are tri-stated, the data maintenance block provides stable input levels on the self-refresh command inputs.

15 Claims, 4 Drawing Sheets

Related U.S. Application Data application No. 15/389,650, filed on Dec. 23, 2016, now Pat. No. 9,727,269, which is a division of application No. 14/834,273, filed on Aug. 24, 2015, now Pat. No. 9,530,483, which is a continuation-in-part of application No. 14/288,094, filed on May 27, 2014, now Pat. No. 9,153,311.

(51) Int. Cl.
*G11C 11/406* (2006.01)
*G06F 13/16* (2006.01)
*G11C 11/4072* (2006.01)
*G06F 12/1027* (2016.01)

(52) U.S. Cl.
CPC ........ *G06F 3/0688* (2013.01); *G06F 12/1027* (2013.01); *G06F 13/1668* (2013.01); *G06F 13/1694* (2013.01); *G11C 11/4072* (2013.01); *G11C 11/40615* (2013.01); *G06F 2212/68* (2013.01)

(58) Field of Classification Search
CPC .............. G06F 13/1668; G06F 13/1694; G06F 2212/68; G11C 11/40615; G11C 11/4072
See application file for complete search history.

(56) References Cited

U.S. PATENT DOCUMENTS

| | | | |
|---|---|---|---|
| 7,836,331 B1 | 11/2010 | Totolos | |
| 8,476,926 B1 | 7/2013 | Brunham et al. | |
| 8,683,166 B1 | 3/2014 | Flateau et al. | |
| 2003/0046530 A1* | 3/2003 | Poznanovic | G06F 15/7867 |
| | | | 713/100 |
| 2003/0200382 A1 | 10/2003 | Wells et al. | |
| 2004/0034732 A1 | 2/2004 | Valin et al. | |
| 2011/0264934 A1 | 10/2011 | Branover et al. | |
| 2014/0043918 A1 | 2/2014 | Ellis et al. | |

OTHER PUBLICATIONS

Micron, DDR4—Advantage of Migrating from DDR3 (via the Wayback Machine), available at https://web.archive.org/web/20120512022758/https://www.micron.com/products/dram/ddr3-to-ddr4 (Year: 2012).*
"DDR2SOH I, DDR2 Memory Controller, VHDL Source Code Overview", ComBlock, Sep. 22, 2010, 16 pages.
"External Memory Interface Handbook vol. 3: Reference Material", DDR2 and DDR3 Sdram Controller with UniPHY User Guide, Altera, Jun. 2011, 511 pages.
"JEDEC Standard—DDR3 SDRAM", JEDEC Solid State Technology Association (JESD79-3C), Nov. 2008, 211 pages.
"Spartan-6 FPGA Memory Controller", User Guide, Aug. 9, 2010, 66 pages.
"Suzaku Hardware Manual Version 1.0.4", Atmark Techno, Inc. Dec. 4, 2004, 35 pages.
"ZedBoard System", ZedBoard Brochure, 2012, 2 pages.
"Zynq-7000, All Programmable SOC", Technical Reference Manual, Feb. 23, 2015, 1863 pages.
Syrivelis, Dimitris , et al., "2006 USENIX Annual Technical Conference", Agenda, May 30-Jun. 3, 2006, Boston, MA, 2006, 1-20 pages.
Syrivelis, Dimitris , et al., "System and Application Level Support for Runtime Hardware Reconfiguration on SOC Platforms", Annual Technical Conference Refereed Paper, from usenix.org, archived at https://web.archive.org/web/20081123044819/usenix.org/events/usenix06/tech/full_papers/syrivelis/syrivelis_html/index.html, 2006, 22 pages.

* cited by examiner

SYSTEM AND METHOD FOR RETAINING DRAM DATA WHEN REPROGRAMMING RECONFIGUREABLE DEVICES WITH DRAM MEMORY CONTROLLERS INCORPORATING A DATA MAINTENANCE BLOCK

CROSS REFERENCE TO RELATED PATENT APPLICATIONS

The present application is a divisional of, and claims priority to, U.S. patent application Ser. No. 15/672,263, entitled "System and Method for Retaining DRAM Data When Reprogramming Reconfigurable Devices with DRAM Memory Controllers Incorporating a Data Maintenance Block Colocated with a Memory Module or Subsystem" filed Aug. 8, 2017, which is a continuation of U.S. patent application Ser. No. 15/389,650, filed Dec. 23, 2016, which is a Divisional of U.S. patent application Ser. No. 14/834,273, filed Aug. 24, 2015, now U.S. Pat. No. 9,530,483, granted on Dec. 27, 2016, which is a continuation-in-part of, and claims priority to, U.S. Pat. No. 9,153,311, entitled "System and Method for Retaining DRAM Data When Reprogramming Reconfigurable Devices with DRAM Memory Controllers" which was issued on Oct. 6, 2015, the disclosures of which are both herein incorporated in their entirety by this reference.

BACKGROUND

The present invention relates, in general, to the field of reconfigurable computing systems. More particularly, the present invention relates to a system and method for retaining dynamic random access memory (DRAM) data when reprogramming reconfigurable devices with DRAM memory controllers incorporating a data maintenance block collocated with a memory module or subsystem. In a further alternative embodiment of the present invention, a memory subsystem implemented in persistent memory is provided which utilizes a communication port coupled to a reconfigurable memory controller that advises the controller as to the current state of the memory as required by the controller.

The majority of today's programmable logic designs include a DRAM based memory solution at the heart of their memory subsystem. Today's DRAM devices are significantly faster than previous generation's, albeit at the cost of requiring increasingly complex and resource intensive memory controllers. One example is in double data rate 3 and 4 (DDR3 and DDR4) controllers which require read and write calibration logic. This added logic was not necessary when using previous versions of DRAM (e.g. DDR and DDR2. As a result, companies are forced to absorb substantial design costs and increased project completion times when designing proprietary DRAM controllers utilizing modern DRAM technology.

In order to mitigate design engineering costs and verification time, it is very common for field programmable gate array (FPGA) designers to implement vendor provided memory controller intellectual property (IP) when including DRAM based memory solutions in their designs. See, for example, Allan, Graham; "DDR IP Integration: How to Avoid Landmines in this Quickly Changing Landscape"; Chip Design, June/July 2007; pp 2022 and Wilson, Ron; "DRAM Controllers for System Designers"; Altera Corporation Articles, 2012.

FPGA designers tend to choose device manufacturer IP designs because they are proven, tested and have the incredible benefit of significantly reduced design costs and project completion times. Many times there is the added benefit of exploiting specialized circuitry within the programmable device to increase controller performance, which is not always readily apparent when designing a controller from scratch.

The downside to using factory supplied IP memory controllers is that there is little flexibility when trying to modify operating characteristics. A significant problem arises in reconfigurable computing when the FPGA is reprogrammed during a live application and the memory controller tri-states all inputs and outputs (I/O) between the FPGA device and the DRAM. The result is corrupted data in the memory subsystem. Therefore, dynamically reconfigurable processors are excluded as viable computing options, especially in regard to database applications or context switch processing. The reason for this is that the time it takes to copy the entire contents of DRAM data and preserve it in another part of the system, reconfigure the processor, then finally retrieve the data and restore it in DRAM is just too excessive.

Current state of the art reconfigurable computing systems will generally commence operations from a reset condition after the system is configured and initialize non-persistent (or volatile) memory subsystem. However, much development of enhancing persistent memory subsystems is currently underway. See for example, Lee, B. C. et al.; "Architecting Phase Change Memory as a Scalable DRAM Alternative"; ISCA June 2009. Persistent memories have the benefit of maintaining previously processed data when reconfiguring or hot-swapping memory controllers.

After reconfiguration, it would be beneficial for the processor section of the system to know the current status of the memory subsystem before it begins initializing the memory, especially in a context switch operation where the processor might require using the same data set between reconfigurations.

SUMMARY

Disclosed herein is a system and method for preserving DRAM memory contents when a reconfigurable device, for example an FPGA having a DRAM memory controller, is reconfigured, reprogrammed or otherwise powered down. When an FPGA is reprogrammed, the DRAM inputs are tri-stated including self-refresh command signals. Indeterminate states on the reset or clock enable inputs results in DRAM data corruption.

In accordance with the system and method of the present invention, an FPGA based DRAM controller is utilized in concert with an internally or externally located data maintenance block, including being collocated on an associated memory module. In operation, the FPGA drives the majority of the DRAM input/output (I/O) and the data maintenance block drives the self-refresh command inputs. Even though the FPGA reconfigures and the majority of the DRAM inputs are tri-stated, the data maintenance block provides stable input levels on the self-refresh command inputs.

Functionally, the data maintenance block does not contain the memory controller and therefore has no point of reference for when and how to initiate the self-refresh commands, particularly the DRAM self-refresh mode. As also disclosed herein, a communication port is implemented between the FPGA and the data maintenance block that allows the memory controller in the FPGA to direct the self-refresh commands to the DRAM via the data maintenance block. Specifically, this entails when to put the DRAM into self-refresh mode and preserve the data in memory.

At this point, the DRAM data has been preserved throughout the FPGA reconfiguration via the self-refresh mode initiated by the data maintenance block, but the DRAM controller must now re-establish write/read timing windows and will corrupt specific address contents with guaranteed write and read data required during the calibration/leveling process. Consequently, using the self-refresh capability of DRAM alone is not adequate for maintaining data integrity during reconfiguration. (It should be noted that the memory addresses used during calibration/leveling are known and typically detailed in the controller IP specification).

In order to effectuate this, the system transmits a "reconfiguration request" to the DRAM controller. Once received, glue logic surrounding the FPGA vendor provided memory controller IP issues read requests to the controller specifying address locations used during the calibration/leveling process. As data is retrieved from the DRAM, it is transmitted via the communication port from the FPGA device to a block of storage space residing within the data maintenance block itself or another location in the system.

Once the process is complete, the data maintenance block sends a self-refresh command to the DRAM and transmits an acknowledge signal back to the FPGA. The data maintenance block recognizes this as an FPGA reconfiguration condition versus an FPGA initial power up condition and retains this state for later use.

Once the FPGA has been reprogrammed, the DRAM controller has re-established calibration settings and several specific addresses in the DRAM have been corrupted with guaranteed write/read data patterns. At this point, glue logic surrounding the vendor memory controller IP is advised by the data maintenance block (through the communication port) that it has awakened from either an initial power up condition or a reconfiguration condition. If a reconfiguration condition is detected, and before processing incoming DMA requests, the controller retrieves stored DRAM data from the data maintenance block (again through the communication port) and writes it back to the specific address locations corrupted during the calibration/leveling process. Once complete, the DRAM controller in the FPGA is free to begin servicing system memory requests in the traditional fashion.

Among the benefits provided in conjunction with the system and method of the present invention is that since the data maintenance block functions to hold the DRAM in self-refresh mode, the FPGA is free to be reprogrammed to perform a very application-specific computing job that may not require DRAM. This means all the device resources previously reserved for creating a DRAM controller are now free to be used for different functions.

Further, the overall computer system benefits from the present invention because data previously stored in DRAM has now been preserved and is available for use by the next application that needs it. This leads to the fact that computing solutions requiring a series of specific data manipulation tasks now have the ability to be implemented in a small reconfigurable processor. Each application performs its intended function and data is passed from application to application between reconfiguration periods via the DRAM.

Importantly, it should also be noted that the DRAM data contents are retained even if the reconfigurable device is powered down. This is especially critical, for example, when the system and method of the present invention is implemented in mobile devices.

In a particular embodiment of the present invention disclosed herein, a system and method is provided for use in a reconfigurable computing environment in hardware, without the need for software intervention.

By incorporating a block of logic and/or memory with a communication port dedicated to updating and maintaining the current state of the memory subsystem within the memory subsystem, upon reconfiguration, the processor will be able to query the memory subsystem and receive the information required to determine how to proceed with respect to accessing the memory subsystem. Such information may include the memory subsystem's state of initialization or readiness, base and limit addresses table lookaside buffer (TLB) mapping contents and the like. This information may be sent out the communications port by the memory controller in real-time and stored in the memory subsystem or it might only be used just before the processor is reconfigured.

A fundamental benefit of this system and method is that, in a persistent memory subsystem, the information held can be quickly transferred back to the memory controller after reconfiguration or a hot swap operation. Advances in new memory technologies such as FLASH and phase change memory (PCM) are capable of creating memory subsystems at the multiple terabyte levels making data persistence all the more important due to ever increasing load times at system boot. The incorporation of this type of persistent memory subsystem to a reconfigurable computing system is enabled by the provision of a fast, tightly coupled port to the memory subsystem for retrieving memory subsystem status which, in turn, shortens the overall start up time following reconfiguration.

Particularly disclosed herein is a computer system comprising a DRAM memory, a reconfigurable logic device having a memory controller coupled to selected inputs and outputs of said DRAM memory and a data maintenance block collocated with the DRAM memory and coupled to the reconfigurable logic device and self-refresh command inputs of the DRAM memory. The data maintenance block is operative to provide stable input levels on the self-refresh command inputs while the reconfigurable logic device is reconfigured.

Also particularly disclosed herein is a method for preserving contents of a DRAM memory associated with a reconfigurable device having a memory controller comprising providing a data maintenance block collocated with the DRAM memory, the data maintenance block being coupled to the reconfigurable device; coupling the data maintenance block to self-refresh command inputs of the DRAM memory; storing data received from the reconfigurable device at the data maintenance block; and maintaining stable input levels on the self-refresh command inputs while the reconfigurable logic device is reconfigured.

Still further particularly disclosed herein is a computer system which comprises a reconfigurable processor comprising a number of processing elements, a memory subsystem query controller and a reconfigurable memory controller and a memory subsystem comprising a plurality of memory storage elements and an associated subsystem status information block, the reconfigurable memory controller is coupled to the memory storage elements and the memory subsystem query controller is coupled to the subsystem status information block and the reconfigurable memory controller wherein the subsystem status information block is operative to provide a current state of the memory subsystem to the reconfigurable memory controller.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
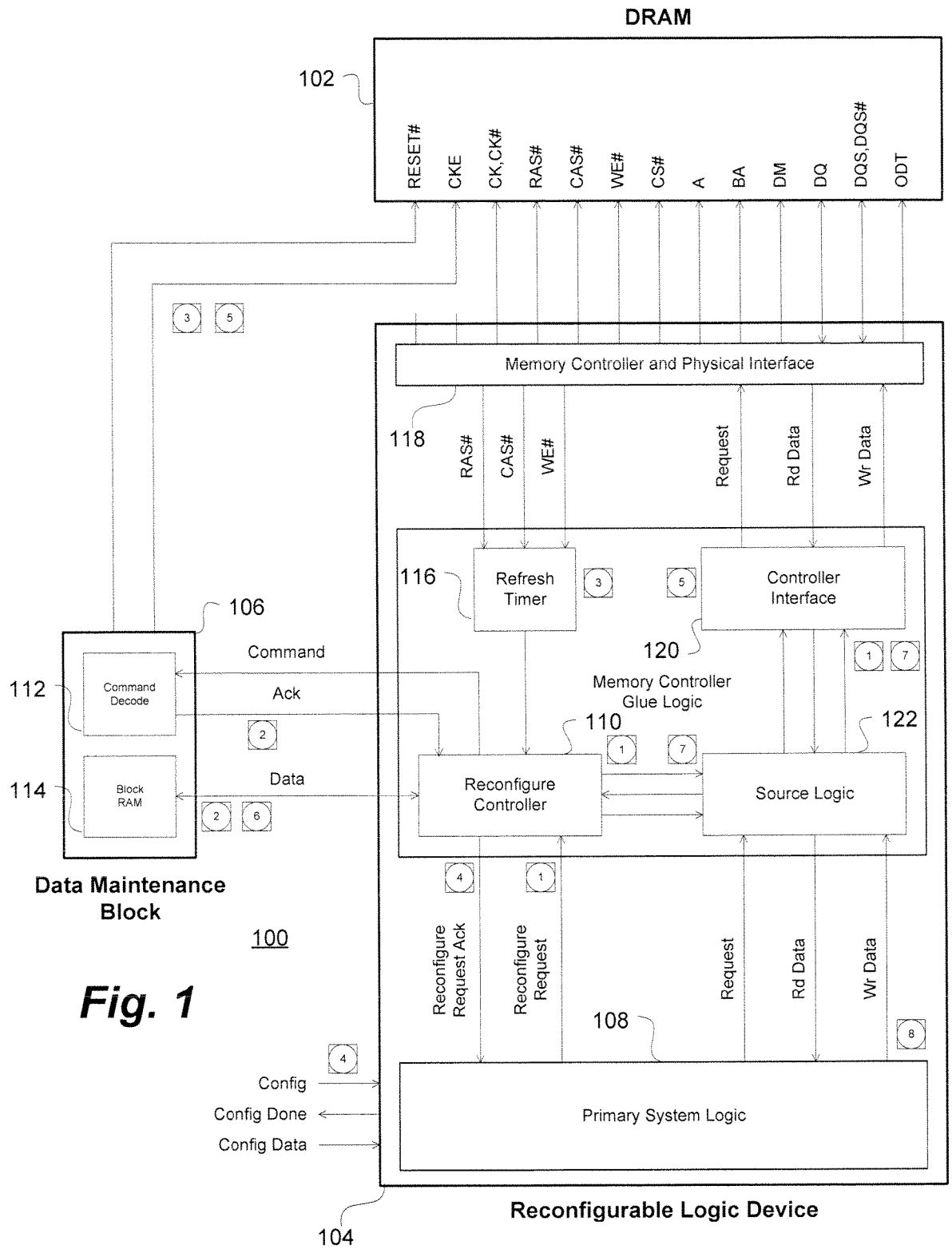
FIG. 1 is a functional block diagram of a computer subsystem comprising a reconfigurable logic device having a reconfigurable DRAM controller with associated DRAM memory and illustrating the data maintenance block of the present invention for retaining DRAM data when the logic device is reconfigured.

With reference now to FIG. 1, a functional block diagram of a computer subsystem 100 comprising a DRAM memory 102 and reconfigurable logic device 104 is shown. In a representative embodiment of the present invention, the reconfigurable logic device 104 may comprise a field programmable gate array (FPGA). However, it should be noted that the reconfigurable logic device 104 may comprise any and all forms of reconfigurable logic devices including hybrid devices, such as a reconfigurable logic device with partial reconfiguration capabilities or an application specific integrated circuit (ASIC) device with reprogrammable regions contained within the chip.

Also illustrated is a data maintenance block 106 in accordance with the present invention for retaining DRAM memory 102 data when the logic device 104 is reconfigured during operation of the computer subsystem 100. In a representative embodiment of the present invention, the data maintenance block 106 may be conveniently provided as a complex programmable logic device (CPLD) or other separate integrated circuit device or, in alternative embodiments, may be provided as a portion of an FPGA comprising the reconfigurable logic device 104.

As illustrated, the reconfigurable logic device 104 comprises a primary system logic block 108 which issues a reconfigure request command to a reconfigure controller 110 and receives a reconfigure request acknowledgement (Ack) signal in return. The reconfigure controller 110, in turn, issues a command to the command decode block 112 of the data maintenance block 106 and receives an acknowledgement (Ack) signal in return. A block RAM portion 114 of the data maintenance block 106 exchanges data with the reconfigure controller 110.

The reconfigure controller 110 receives an input from a refresh timer 116 which is coupled to receive row address select (RAS #), column address select (CAS #) and write enable (WE #) signals from a memory controller and physical interface block 118. The memory controller and physical interface block 118 also provides the RAS #, CAS # and WE # signals to the DRAM memory 102 as well as clock (CK, CK #), chip select (CS #), address (A), bank address (BA), data mask (DM) and on-die termination (ODT) input signals. Bidirectional data (DQ) input/output (I/O) and differential data strobe signals (DQS/DQS #) are exchanged between the DRAM memory 102 and the memory controller and physical interface block 118 as shown. The data maintenance block 106 is coupled to the DRAM memory 102 to supply reset (RESET #) and clock enable (CKE #) signals thereto.

The memory controller and physical interface block 118 responds to a request from the controller interface 120 to provide data read from the DRAM memory 102 (Rd Data) and to receive data to be written to the DRAM memory 102 (Wr Data) as shown. A source logic block 122 is coupled to the controller interface 120 as well as the reconfigure controller 110 as also illustrated. The source logic block 122 receives a data request from the primary system logic block 108 and supplies data read from the DRAM memory 102 while receiving data to be written thereto.

As indicated by the operation at numeral 1, a reconfiguration request is received at the reconfigure controller 110 from the primary system logic block 108 of the reconfigurable logic device 104. The reconfigure controller 110 initiates direct memory access (DMA) read requests to memory addresses used in a calibration/leveling sequence after the reconfigurable logic device 104 is reconfigured. Returned data is stored in a small section of block RAM (not shown) in the reconfigure controller 110.

As indicated by the operation at numeral 2, the reconfigure Controller 110 stores its block RAM contents in another small section of block RAM 114 located in the data maintenance block 106. When complete, the data maintenance block 106 asserts an acknowledge signal from its command decode block 112. At the operation indicated by numeral 3, the reconfigure controller 110 detects a refresh command from the refresh timer 116, waits a refresh cycle time (tRFc) and instructs the data maintenance block 106 to de-assert CKE to the DRAM memory 102.

The reconfigure controller 110 asserts the Reconfigure Request Ack signal at the operation indicated by numeral 4 and the reconfigurable logic device 104 is reconfigured. As indicated by the operation at numeral 5, the reconfigure controller 110 recognizes a post-reconfigure condition (Ack=High), holds the memory controller and physical interface 118 in reset and instructs the data maintenance block 106 to assert CKE to the DRAM memory 102. The memory controller and physical interface 118 is then released from reset and initializes the DRAM memory 102.

At the operation indicated by numeral 6, the reconfigure controller 110 retrieves the data maintenance block 106 block RAM 114 contents and stores it in a small section of block RAM (not shown) in the reconfigure controller 110. The reconfigure controller 110 detects that the memory controller and physical interface 118 and DRAM memory 102 initialization is complete at the operation indicated by numeral 7 and initiates DMA write requests to restore the memory contents corrupted during the calibration/leveling sequence with the data values read prior to reconfiguration. At the operation indicated by numeral 8, the memory controller and physical interface 118 glue logic (comprising reconfigure controller 110, refresh timer 116, controller interface 120 and source logic block 122) resumes DMA activity with the primary system logic 108 in a conventional fashion.

It should be noted certain of the aforementioned operational steps may, in fact, operate substantially concurrently. Further, while functionally accurate, some of the operational steps enumerated have been listed out of order to provide logical continuity to the overall operation and to facilitate comprehensibility of the process. In a particular implementation of the system and method of the present invention, one or more of the operational steps disclosed may be conveniently reordered to increase overall hardware efficiency. Moreover, steps which can serve to facilitate relatively seamless integration in an active application can be provided in addition to those described as may be desired.

Figure 2:
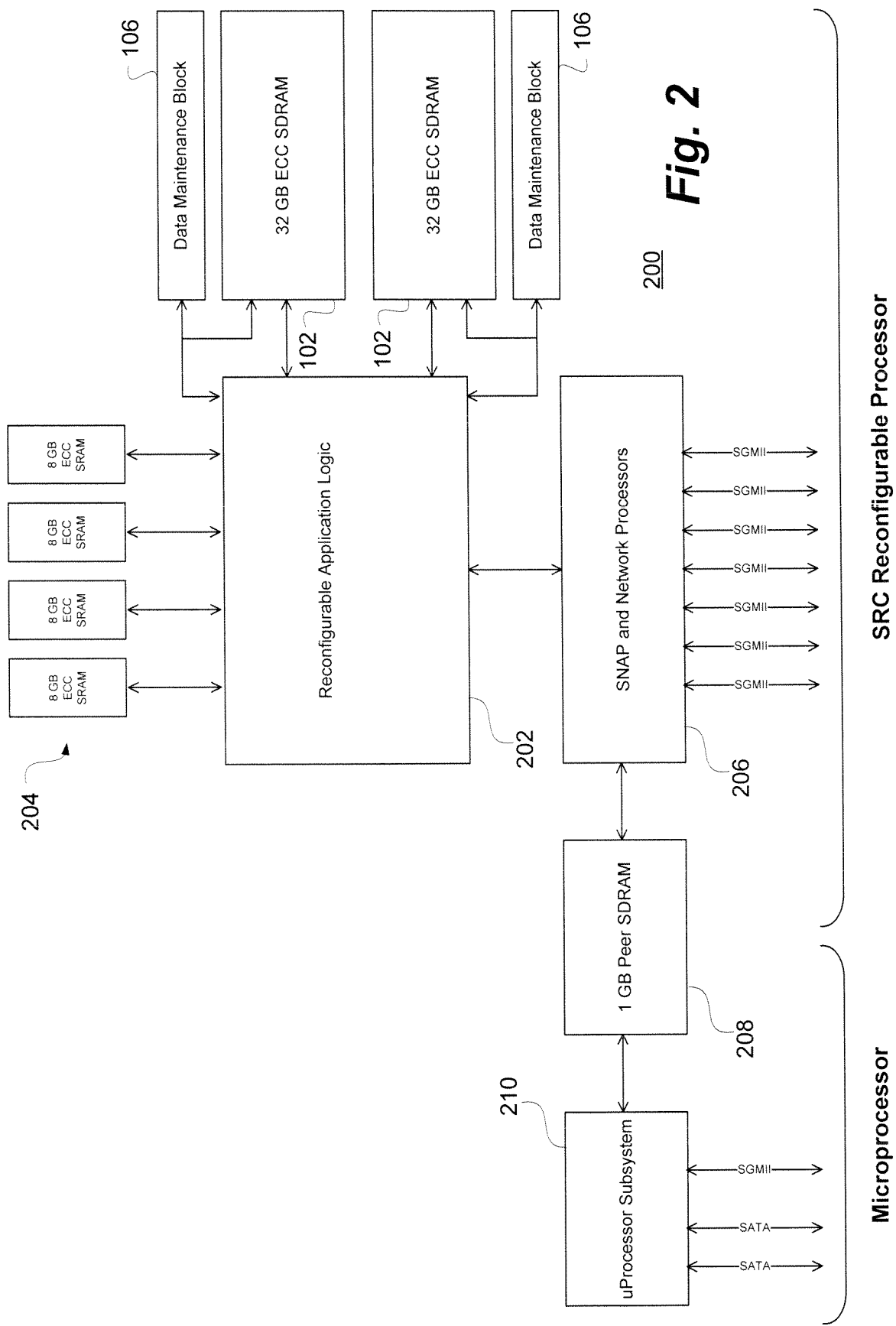
FIG. 2 is a block diagram of a reconfigurable computer system, incorporating a pair of data maintenance blocks and DRAM memory in accordance with the system and method of the present invention in association with reconfigurable application logic.

With reference additionally now to FIG. 2, a block diagram of a reconfigurable computer system 200 is illustrated incorporating a pair of data maintenance blocks 106 and DRAM memory 102 in accordance with the system and method of the present invention in association with reconfigurable application logic 202. In this representative embodiment of a reconfigurable computer system 200, the DRAM memory 102 is illustrated in the form of 32GB error correction code (ECC) synchronous dynamic random access memory (SDRAM).

The reconfigurable application logic 202 is coupled to the data maintenance blocks 106 and DRAM memory 102 as depicted and described previously with respect to the preceding figure and is also illustrated as being coupled to a number of 8 GB ECC static random access memory (SRAM) memory modules 204. The reconfigurable application logic 202 is also coupled to a SNAP™ and network processors block 206 having a number of serial gigabit media independent interface (SGMII) links as shown. It should be noted that the DRAM memory 102 controller in the reconfigurable application block 202 may be omitted upon subsequent reconfigurations as the DRAM memory 102 data contents will be maintained in the data maintenance blocks 106.

The SNAP and network processors block 206 shares equal read/write access to a 1 GB peer SDRAM system memory 208 along with a microprocessor subsystem 210. The microprocessor subsystem 210, as illustrated, also comprises an SGMII link as well as a pair of serial advanced technology attachment (SATA) interfaces.

Figure 3:
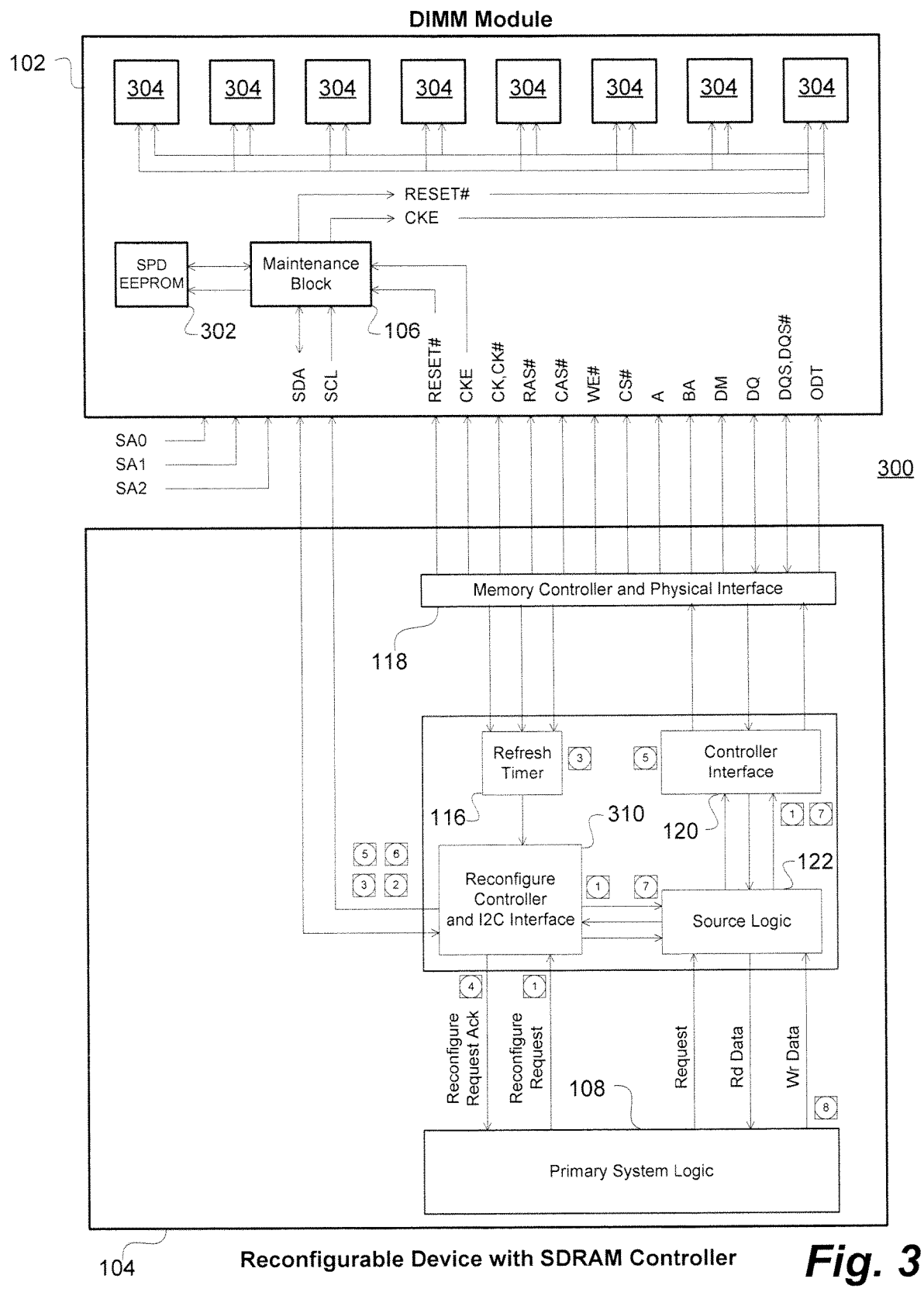
FIG. 3 is a functional block diagram of an alternative embodiment of a computer subsystem comprising a reconfigurable logic device having a reconfigurable DRAM controller with associated DRAM memory and illustrating the data maintenance block of the present invention being located on the SDRAM memory subassembly; and, FIG. 4 is a functional block diagram of another possible embodiment of a computer subsystem in accordance with the principles of the present invention wherein a reconfigurable processor comprises a memory subsystem query controller for interfacing with a subsystem status information block associated with the memory subsystem.

With reference additionally now to FIG. 3, a functional block diagram of an alternative embodiment of a computer subsystem 300 is shown comprising a reconfigurable logic device 104 having a reconfigurable DRAM controller with associated DRAM memory 102 and illustrating the data maintenance block 106 of the present invention being co-located on the SDRAM memory subassembly. As Illustrated, the DRAM memory 102 comprises, in pertinent part, a serial presence detect (SPD) EEPROM 203 and a number of volatile memory storage elements 304. The DRAM memory 102 is also illustrated as being coupled to receive address inputs SA0, SA1 and SA2.

In this particular embodiment of the computer subsystem 300, the reconfigure controller 310 is functionally the same as the reconfigure controller 110 described and illustrated with respect to the preceding figures but also comprises an inter-integrated circuit (I2C) interface including serial data lines (SDA) and serial clock lines (SCL) for communications between the reconfigure controller 310 and the data maintenance block 106. With respect to other aspects of the computer subsystem 300 illustrated, like structure to that previously disclosed and described with respect to the preceding figures is like numbered and the foregoing description thereof shall suffice here for.

As indicated by the operation at numeral 1, a reconfiguration request is received and the reconfigure controller 310 initiates DMA read requests to memory addresses used in the calibration/leveling sequence after the reconfigurable logic device 104 is reconfigured. As further indicated by the operation at numeral 2, returned data is sent to the DRAM memory 102 DIMM module via the I2C bus and stored in the data maintenance block 106 or unused portions of the SPD EEPROM 302. With respect to the operations depicted by numerals 3 through 8, these operations are essentially as previously described in conjunction with the embodiment of the computer subsystem 100 of FIG. 1.

Once more, it should be noted that certain of the aforementioned operational steps may, in fact, operate substantially concurrently. Further, while functionally accurate, some of the operational steps enumerated have been listed out of order to provide logical continuity to the overall operation and to facilitate comprehensibility of the process. In a particular implementation of the system and method of the present invention, one or more of the operational steps disclosed may be conveniently re-ordered to increase overall hardware efficiency. Moreover, steps which can serve to facilitate relatively seamless integration in an active application can be provided in addition to those described as may be desired.

In this alternative embodiment of the present invention, the reconfigurable logic device 104 may, as with the embodiment of FIG. 1, comprise an FPGA. However, it should be noted that the reconfigurable logic device 104 may again comprise any and all forms of reconfigurable logic devices including hybrid devices, such as a reconfigurable logic device with partial reconfiguration capabilities or an ASIC device with reprogrammable regions contained within the chip.

As before, the data maintenance block 106 in accordance with the present invention functions to retain DRAM memory 102 data when the logic device 104 is reconfigured during operation of the computer subsystem 300. In a representative embodiment of the present invention, the data maintenance block 106 may be conveniently provided as co-located on the DRAM memory 102 (e.g. an SDRAM DIMM module) itself whether as part of the storage silicon itself or as a die stacked in what is an already stacked memory device.

In operation, the memory controller 118 can utilize the I2C bus as a communications port to submit power up/down requests and data to/from the data maintenance block 106. In this manner, the need for a separate set of pins or wires to the data maintenance block is obviated. As a practical matter, FPGA memory controller IP typically does not utilize the SPD information from the DIMM module and the designer must determine ahead of time the memory timings and topology and configure the controller IP to that single specification. In the event the I2C bus is used by the controller, a sniffer circuit in the data maintenance block 106 may be employed to monitor the I2C bus traffic and enable a determination as to when a reconfigure process was forthcoming. In this regard, the data maintenance block 106 might employ a bogus I2C protocol unrecognizable by the EEPROM to prevent possible corruption of its contents.

With the use of the existing I2C serial bus for communications between the memory controller 118 and the DIMM DRAM memory 102, the data maintenance block 106 has the additional task of controlling serial presence detect contents from the SPD EEPROM 302 at memory initialization time. Moreover, by incorporating the data maintenance block 106 in the DRAM memory 102, SDRAM memory persistence may be maintained when "hot-swapping" the reconfigurable logic device 104 containing the reconfigure controller 310 with a different reconfigurable logic device 104 comprising a reconfigure controller 310.

Figure 4:
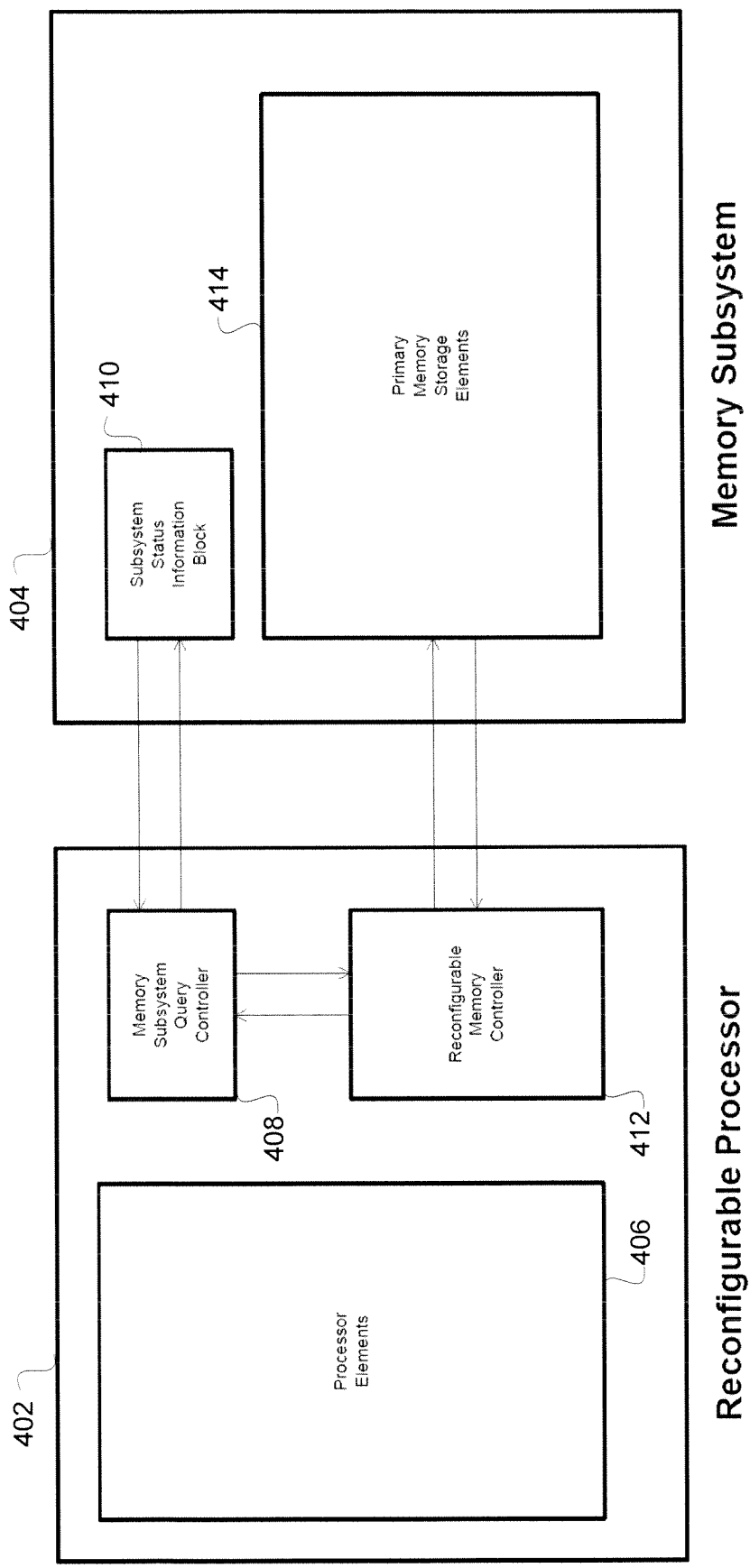

With reference additionally now to FIG. 4, a functional block diagram of another possible embodiment 5 of a computer subsystem 400 in accordance with the principles of the present invention is shown wherein a reconfigurable processor 402 comprises a memory subsystem query controller 408 for interfacing with a subsystem status information block 410 associated with 10 the memory subsystem 404. As illustrated, the reconfigurable processor 402 comprises various processing elements 406 and a reconfigurable memory controller 412 in communication with the memory subsystem query controller 408 and the primary memory 15 storage elements 414 in the memory subsystem 404

The embodiments of the computer subsystems of the preceding FIGS. 1-3 effectively provide persistent, reconfigurable computer system memory utilizing non-persistent DRAM. In distinction, the computer subsystem 400 is configured utilizing inherently persistent memory such as NAND Flash, PCM, FeRAM, 3D Xpoint or the like for the primary memory storage elements 414 while incorporating a piece of logic and RAM in a discrete block located on a memory device, module or subsystem such as the subsystem status information block 410. A communication port couples the subsystem status information block 410 to a memory subsystem query controller 408 in the reconfigurable processor 402.

During runtime, a portion of the reconfigurable memory controller 412 transmits status information to the memory subsystem 404 while the subsystem status information block 410 is responsible for updating and maintaining data received from the controller. After the reconfigurable processor 402 completes a first task, it will be reconfigures and begin the next task. Before it initializes the memory, the controller will query the memory as to the previous status and, as a result, receive information as to when, how, where and the lie to begin the next task. When queried, the memory might provide a response indicating that it is already initialized and ready and indicate to the processor that, prior to its reconfiguration, the task involved a given data set located, for example, at a specified base address. The memory might also indicate the state of the reconfigurable processor 402 TLB mapping and send a copy to the processor so that it can be recreated unless the same as before. At this point, the reconfigurable processor 402 can begin running its user code.

For continuity and clarity of the description herein, the term "FPGA" has been used in conjunction with the representative embodiment of the system and method of the present invention and refers to just one type of reconfigurable logic device. However, it should be noted that the concept disclosed herein is applicable to any and all forms of reconfigurable logic devices including hybrid devices, inclusive of reconfigurable logic devices with partial reconfiguration capabilities or an ASIC device with reprogrammable regions contained within the chip.

Representative embodiments of dynamically reconfigurable computing systems incorporating the DRAM memory 102, reconfigurable logic device 104, associated microprocessors and programming techniques are disclosed in one or more of the following United States Patents and United States Patent Publications, the disclosures of which are herein specifically incorporated by this reference in their entirety: U.S. Pat. Nos. 6,026,459; 6,076,152; 6,247,110; 6,295,598; 6,339,819; 6,356,983; 6,434,687; Pat. No. 10 6,594,736; 6,836,823; 6,941,539; 6,961,841; 6,964,029; 6,983,456; 6,996,656; 7,003,593; 7,124,211; 7,134,120; Pat. No. 15 7,149,867; 7,155,602; 7,155,708; 7,167,976; 7,197, 575; 7,225,324; 7,237,091; 7,299,458; 7,373,440; 7,406, 573; Pat. No. 20 7,421,524; 7,424,552; 7,565,461; 7,620, 800; 7,680,968; 7,703,085; 7,890,686; 8,589,666; U.S. Pat. Pub. No. 2012/0117318; U.S. Pat. Pub. No. 2012/0117535; and U.S. 25 Pat. Pub. No. 2013/0157639. While there have been described above the principles of the present invention in conjunction with specific apparatus and methods, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

The invention claimed is:
1. An apparatus comprising:
a reconfigurable logic device having a memory controller operable to be coupled to selected inputs and outputs of a DRAM memory; and
a data maintenance block operable to be coupled to said reconfigurable logic device and self-refresh command inputs of said DRAM memory, said data maintenance block operative to provide stable input levels on said self-refresh command inputs while said reconfigurable logic device is reconfigured.

2. The apparatus of claim 1 wherein said reconfigurable logic device comprises an FPGA.

3. The apparatus of claim 2 wherein said FPGA comprises said data maintenance block.

4. The apparatus of claim 1 wherein said DRAM memory comprises DDR3 compliant memory devices.

5. The computer system of claim 1 wherein said DRAM memory comprises DDR4 compliant memory devices.

6. A computer system comprising:
- a reconfigurable logic device having a memory controller operable to be coupled to selected inputs and outputs of a DRAM memory;
- a data maintenance block operable to be coupled to self-refresh command inputs of said DRAM memory; and
- a reconfigure controller coupled to the data maintenance block and operable to initiate direct memory access read requests of data from the DRAM memory, store data from said read requests in said data maintenance block prior to a reconfiguration of the reconfigurable logic device and initiate write requests to the DRAM memory with said data after the reconfiguration of the reconfigurable logic device,
- wherein said data maintenance block is operative to provide stable input levels on said self-refresh command inputs while said reconfigurable logic device is reconfigured.

7. The computer system of claim 6 wherein said reconfigurable logic device comprises an FPGA.

8. The computer system of claim 7 wherein said FPGA comprises said data maintenance block.

9. The computer system of claim 6 wherein said DRAM memory comprises DDR3 compliant memory devices.

10. The computer system of claim 6 wherein said DRAM memory comprises DDR4 compliant memory devices.

11. A computer system, comprising:
- a reconfigurable logic device operable to access data within a DRAM memory; and
- a data maintenance block operable to be coupled to self-refresh command inputs of the DRAM memory and operable to signal the DRAM memory of one of a reconfigure condition and a post-reconfigure condition of the reconfigurable logic device, the data maintenance block further operative to provide stable input levels on said self-refresh command inputs while said reconfigurable logic device is reconfigured.

12. The computer system of claim 11 wherein said reconfigurable logic device comprises an FPGA.

13. The computer system of claim 12 wherein said FPGA comprises said data maintenance block.

14. The computer system of claim 11 wherein said DRAM memory comprises DDR3 compliant memory devices.

15. The computer system of claim 11 wherein said DRAM memory comprises DDR4 compliant memory devices.

\* \* \* \* \*